(12) United States Patent
Toyoda (10) Patent No.: US 10,095,073 B2
(45) Date of Patent: Oct. 9, 2018

(54) DISPLAY DEVICE

(71) Applicant: Japan Display Inc., Minato-tu (JP)

(72) Inventor: Hironori Toyoda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/707,139

(22) Filed: Sep. 18, 2017

(65) Prior Publication Data

US 2018/0088419 A1  Mar. 29, 2018

(30) Foreign Application Priority Data

Sep. 28, 2016 (JP) .................. 2016-189466

(51) Int. Cl.
*G02F 1/1343* (2006.01)
*G02F 1/1333* (2006.01)
*G02F 1/1337* (2006.01)
*G02F 1/139* (2006.01)

(52) U.S. Cl.
CPC ........ *G02F 1/134336* (2013.01); *G02F 1/139* (2013.01); *G02F 1/133345* (2013.01); *G02F 1/133707* (2013.01); *G02F 2201/128* (2013.01)

(58) Field of Classification Search
CPC .................................. H01J 27/322; H01J 1/62
See application file for complete search history.

(56) References Cited

U.S. PATENT DOCUMENTS

2006/0290276 A1* 12/2006 Cok ...................... H01L 27/322
                                                                    313/512

FOREIGN PATENT DOCUMENTS

JP     2004-119277      4/2004
JP     2007-265764     10/2007

* cited by examiner

*Primary Examiner* — Anne Hines
(74) *Attorney, Agent, or Firm* — Oblon, McClelland, Maier & Neustadt, L.L.P.

(57) ABSTRACT

A display device includes: a pixel electrode formed on an insulating surface; a bank that covers an edge of the pixel electrode and at the same time has an opening in which an upper surface of the pixel electrode is not covered by the bank; an organic layer that covers the opening and includes a light emitting layer; an opposing electrode that is formed on the organic layer and the bank; a cap layer that is formed on the opposing electrode; and a hygroscopic layer that contains a hygroscopic agent and that is formed on the opposing electrode in a region that overlaps with the bank but does not overlap with the opening in a planar view from a display surface side.

5 Claims, 7 Drawing Sheets

DISPLAY DEVICE

CROSS-REFERENCE TO RELATED APPLICATION

The present application claims priority from Japanese application JP2016-189466 filed on Sep. 28, 2016, the content of which is hereby incorporated by reference into this application.

BACKGROUND OF THE INVENTION

1. Field of the Invention

One or more embodiments of the present invention relate to a display device.

2. Description of the Related Art

As to a display device such as an organic EL (Electro Luminescence) display device, there is a case where a light emitting element such as an organic light emitting diode (OLED) is controlled by using a switching element such as a thin film transistor, to thereby display an image.

Japanese Patent Application Laid-Open No. 2004-119277 describes an organic EL display device provided with an hygroscopic heat conduction solid arranged so that it contacts both of an organic EL lamination film and a sealing member.

Japanese Patent Application Laid-Open No. 2007-265764 describes an organic EL display element where a hygroscopic layer formed by a vapor phase film formation method is included between an organic EL element substrate and a sealing member, and a hygroscopic layer formed on a non-display region is larger than a hygroscopic layer formed on the display region.

As in Japanese Patent Application Laid-Open No. 2004-119277 and in Japanese Patent Application Laid-Open No. 2007-265764, by providing a hygroscopic layer that contains a hygroscopic agent, a deterioration of an organic layer including a light emitting layer due to moisture can be prevented. However, if the hygroscopic layer is arranged over a light emitting region, there is a case where light is absorbed by the hygroscopic layer, and a light emitting efficiency of an organic light emitting diode is degraded.

SUMMARY OF THE INVENTION

The purpose of the present invention is to provide a display device where the deterioration of an organic light emitting diode due to moisture is prevented and at the same time the light emitting efficiency is improved.

A display device of the present invention includes: a pixel electrode formed on an insulating surface; a bank that covers an edge of the pixel electrode and at the same time has an opening in which an upper surface of the pixel electrode is not covered by the bank; an organic layer that covers the opening and includes a light emitting layer; an opposing electrode that is formed on the organic layer and the bank; a cap layer that is formed on the opposing electrode; and a hygroscopic layer that contains a hygroscopic agent and that is formed on the opposing electrode in a region that overlaps with the bank but does not overlap with the opening in a planar view from a display surface side.

DETAILED DESCRIPTION OF THE INVENTION

Below, respective embodiments of the present invention are explained with reference to the accompanying drawings. Note that disclosed embodiments are merely examples, and an appropriate variation that a person skilled in the art can easily arrive at without departing from the spirit of the present invention is naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

Figure 1:
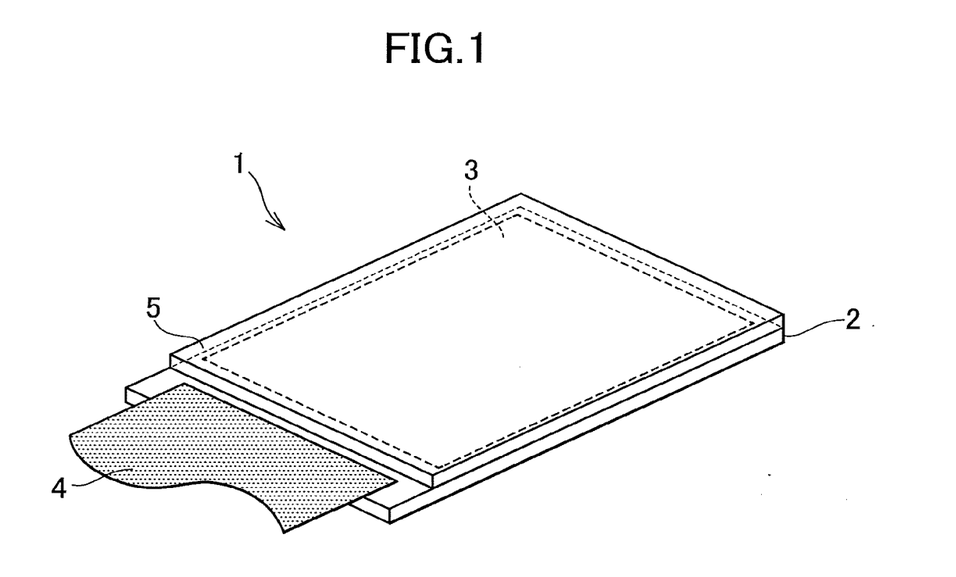
FIG. 1 is a perspective diagram illustrating an organic EL display device according to an embodiment of the present invention.

FIG. 1 is a perspective diagram illustrating an organic EL display device 1 according to an embodiment of the present invention. The organic EL display device 1 includes a display region 3 where a plurality of pixels are arranged on a substrate 2 formed of glass or a flexible material. On the substrate 2, a driving circuit (not illustrated) for controlling the plurality of pixels may be formed. Further, a signal and an electric power for controlling the plurality of pixels are input via a flexible print circuit (FPC) 4. The FPC 4 is crimped to a terminal (not illustrated) formed on the substrate 2, and is electrically connected to the terminal. The organic EL display device 1 according to the present embodiment includes an opposing substrate 5 that protects the display region 3. The opposing substrate 5 may be substituted by, for example, a surface cover glass of an electric device into which the organic EL display device 1 is incorporated.

Figure 2:
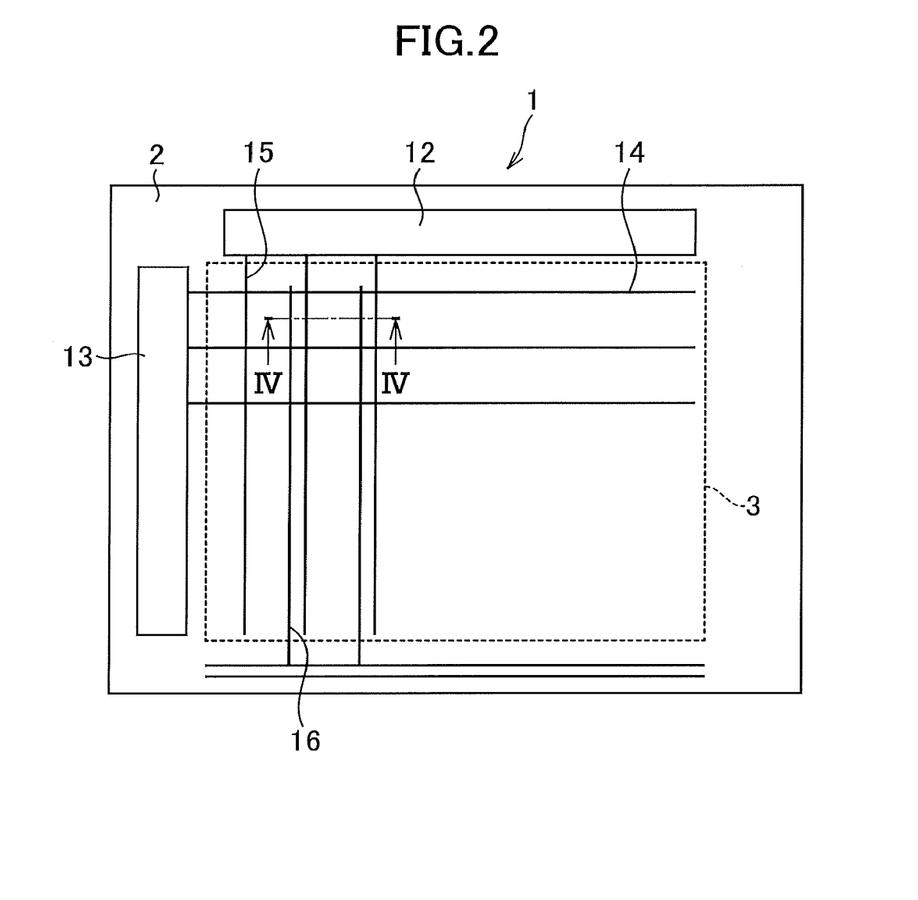
FIG. 2 is a wiring diagram of an organic EL display device according to the embodiment of the present invention.
Figure 3:
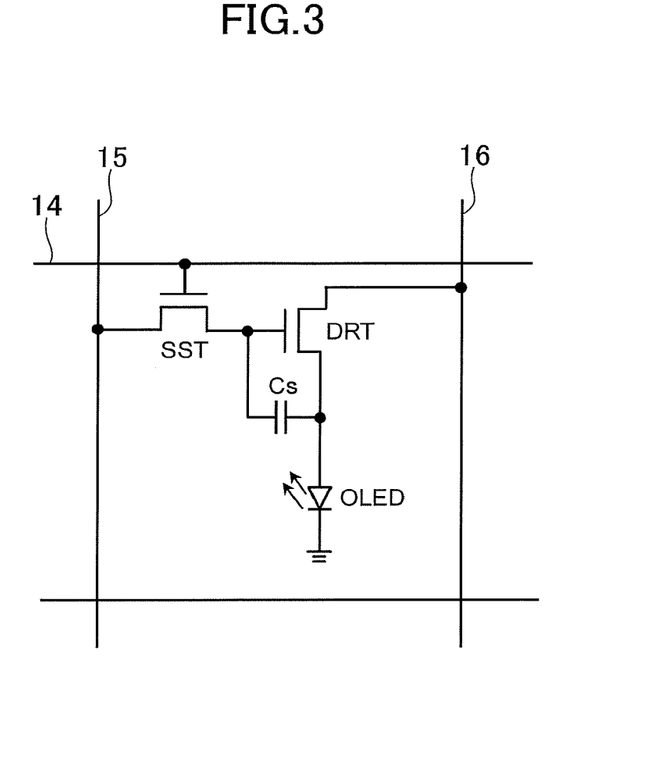
FIG. 3 is a circuit diagram of a pixel of an organic EL display device according to the embodiment of the present invention.

FIG. 2 is a planar diagram of the organic EL display device 1 according to the embodiment of the present invention. Further, FIG. 3 is a circuit diagram of a pixel of the organic EL display device 1 according to the embodiment of the present invention. The organic EL display device 1 controls the respective pixels provided in a matrix form in the display region 3 of substrate 2 by an image signal driving circuit 12 and a scan signal driving circuit 13 and displays an image. Here, the image signal driving circuit 12 is a circuit that generates and transmits an image signal to be sent to the respective pixels. Further, the scan signal driving circuit 13 is a circuit that generates and transmits a scan signal for a TFT (Thin Film Transistor) provided in a pixel.

Although in FIG. 2, the image signal driving circuit 12 and the scan signal driving circuit 13 are illustrated as being formed individually, they may be incorporated into a single IC (Integrated Circuit), and may also be formed separately as three or more parts. In the case where the image signal driving circuit 12 and the scan signal driving circuit 13 are incorporated in an IC, the IC may be mounted on the substrate 2, and may also be mounted on the FPC 4 illustrated in FIG. 1.

A scan signal line 14 that delivers a signal from the scan signal driving circuit 13 is electrically connected to a gate of a pixel transistor SST formed in each pixel region. The scan signal line 14 is shared by pixel transistors aligned in one row. The pixel transistor SST is a transistor whose source or drain is electrically connected to a gate of a driving transistor DRT. The driving transistor DRT is, for example, a field effect transistor of an n-type channel, whose source is electrically connected to an anode of an organic light emitting diode OLED. A cathode of the organic light emitting diode OLED is fixed to be at a ground electric potential or a negative electric potential. At this time, an electric current runs in the organic light emitting diode OLED from the anode to the cathode. Further, an image signal line 15 that delivers a signal from the image signal driving circuit 12 is electrically connected to the source or the drain of the pixel transistor SST. The image signal line 15 is shared by pixel transistors aligned in one column. When a scan signal is applied to the scan signal line 14, the pixel transistor SST is turned to an ON-state. In the above state, when an image signal is applied to the image signal line 15, an image signal voltage is applied to the gate of the driving transistor DRT, a voltage in accordance with the image signal is written into a holding capacitance Cs, and the driving transistor DRT is turned into the ON-state. An electric power source line 16 is electrically connected to a drain of the driving transistor DRT. An electric power source voltage for having the organic light emitting diode OLED emit light is applied to the electric power source line 16. When the driving transistor DRT is turned to the ON-state, an electric current in accordance with a magnitude of the image signal voltage runs in the organic light emitting diode OLED, and the organic light emitting diode OLED emits light.

Figure 4:
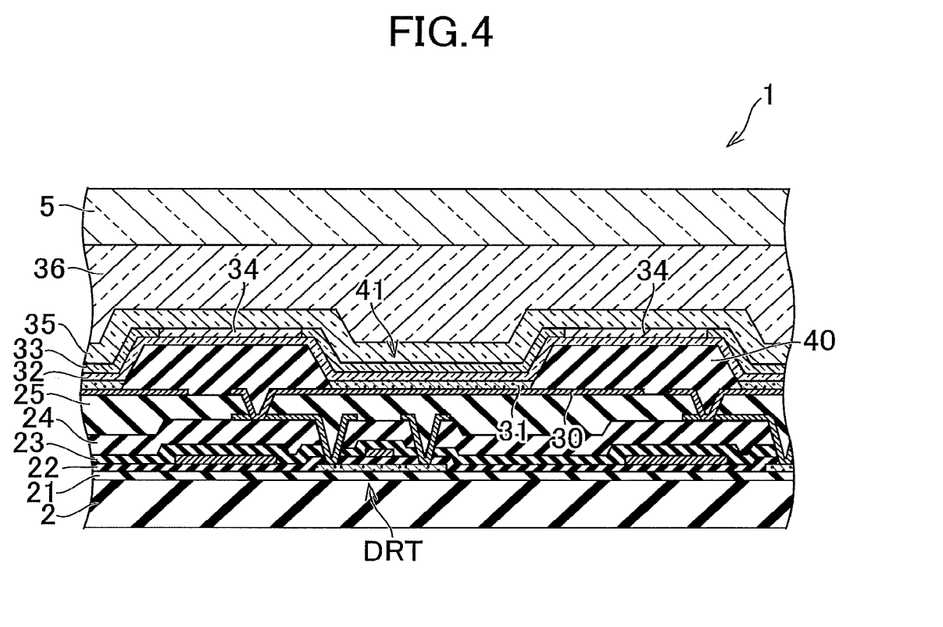
FIG. 4 is a cross sectional diagram of a pixel of an organic EL display device according to the embodiment of the present invention.
Figure 5:
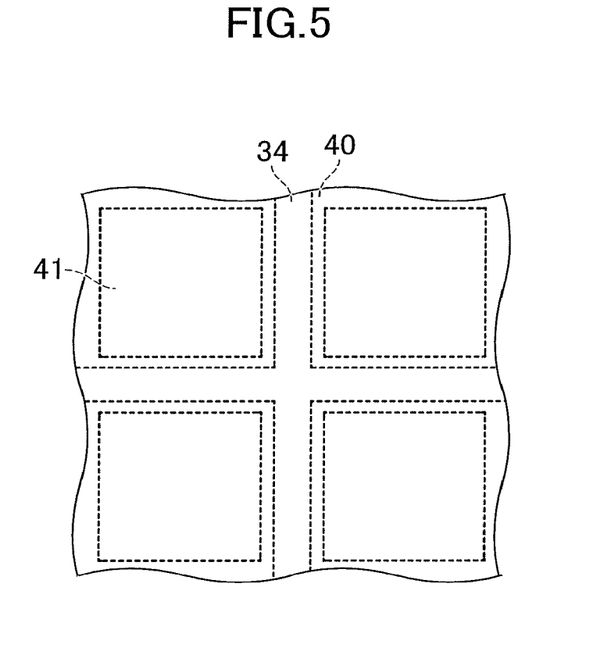
FIG. 5 is a planar diagram of a pixel of an organic EL display device according to the embodiment of the present invention.

FIG. 4 is a cross sectional diagram of a pixel of the organic EL display device 1 according to the embodiment of the present invention. FIG. 4 is a cross sectional diagram of a pixel taken along a line IV-IV illustrated in FIG. 2. Further, FIG. 5 is a planar diagram of a pixel of the organic EL display device 1 according to the embodiment of the present invention. FIG. 5 illustrates a magnified view of the display region 3 of the organic EL display device 1, and illustrates a planar view of a pixel of the organic EL display device 1 when it is seen from a display surface side. Although FIG. 5 illustrates four pixels having a rectangular shape, the shape of the pixels may be a shape other than the rectangular shape, such an L-letter shape.

In the organic EL display device 1 according to the present embodiment, a first insulating film 21 is provided on the substrate 2, and a channel of the driving transistor DRT is formed on the first insulating film 21. The second insulating film 22 is provided on the first insulating film 21, and the gate of the driving transistor DRT is provided on the second insulating film 22. A third insulating film 23 is provided on the second insulating film 22, and a fourth insulating film 24 is provided on the third insulating film 23. A through hole is formed on the second insulating film 22, the third insulating film 23, and the fourth insulating film 24.

In the through hole, a source electrode and a drain electrode that are electrically connected to the channel of the driving transistor DRT are provided.

A planarizing film 25 is provided on the fourth insulating film 24. As to the organic EL display device 1 according to the present embodiment, the planarizing film 25 is formed of an organic insulating material, and a surface thereof is an insulating surface. A pixel electrode 30 is formed on an upper surface of the planarizing film 25. The upper surface of the planarizing film 25 is an insulating surface, and the pixel electrode 30 is formed on the insulating surface. A bank 40 is formed on the pixel electrode 30 and the planarizing film 25. The bank 40 covers an edge of the pixel electrode 30, and at the same time includes an opening 41 in which an upper surface of the pixel electrode 30 is not covered by the bank 40. In the opening 41 of the bank 40, an organic layer 31 that includes a light emitting layer is formed. The organic layer 31 is formed so as to cover the opening 41. An opposing electrode 32 is formed on the organic layer 31 and on the bank 40. The opposing electrode 32 is formed of a material that transmits light emitted from the organic layer 31.

A cap layer 33 is formed on the opposing electrode 32 so as to cover the opening 41. The cap layer 33 is formed of a material that transmits the light emitted from the organic layer 31, and is constituted by a single layer in the present embodiment. As to the cap layer 33, its thickness and refractive index are selected so that the light emitted from the organic layer 31 is not reflected back to the organic layer 31 side.

On the opposing electrode 32 in a region that overlaps with the bank 40 but does not overlap with the opening 41 in a planar view from the display surface side, a hygroscopic layer 34 containing a hygroscopic agent is formed. The hygroscopic layer 34 is not formed over the light emitting region that is a region where the opposing electrode 32 and the organic layer 31 contact with each other. Therefore, light emitted from the organic layer 31 toward the display surface side is not absorbed by the hygroscopic layer 34. Thus, a light emitting efficiency of the organic light emitting diode improves as compared with the case where the hygroscopic layer 34 is provided over the organic layer 31. Further, light emitted from the organic layer 31 toward the bank 40 side is absorbed by the hygroscopic layer 34, and a mixture of colors can be prevented.

In the organic EL display device 1 according to the present embodiment, the hygroscopic layer 34 is a layer formed by a material made by mixing the material that constitutes the cap layer 33 and the hygroscopic agent. The hygroscopic layer 34 may be formed for example by co-deposition of the material that constitutes the cap layer 33 and the hygroscopic agent. In that case, it may be arranged that the cap region 33 is deposited on a region outside the regions over the bank 40, and then the material that constitutes the cap layer 33 and the hygroscopic agent are co-deposited over the bank 40.

Since the hygroscopic layer 34 is a layer formed of the material made by mixing the material that constitutes the cap layer 33 and the hygroscopic agent, the hygroscopic agent can more stably exists on the opposing electrode 32, and additionally a contacting area of the hygroscopic agent and a sealing film 35 is reduced. Thus, a quality change of the hygroscopic agent becomes less likely to occur.

In the organic EL display device 1 according to the present embodiment, the hygroscopic agent contained in the hygroscopic layer 34 contains at least one of barium oxide, calcium oxide, calcium and zeolite. By providing the hygroscopic layer 34 containing those materials, a large effect can be achieved that prevents deterioration of the organic layer 31 due to moisture. Whereas, a hygroscopic layer 34 containing a hygroscopic material other than those may be provided, as well.

In the organic EL display device 1 according to a first variation of the embodiment of the present invention, the hygroscopic layer 34 does not contain the material that constitutes the cap layer 33, and it is a layer formed of a material that contains a hygroscopic agent. The organic EL display device 1 according to the first variation of the embodiment of the present invention is different from the organic EL display device 1 according to the embodiment of the present invention in that the hygroscopic layer 34 is formed only of a hygroscopic agent or is formed of a hygroscopic agent and a material other than the material that constitutes the cap layer 33, but its cross sectional structure is the same as the one illustrated in FIG. 4. As to the organic EL display device 1 according to the first variation, in a region over the bank 40, the hygroscopic layer 34 is formed only of a hygroscopic agent, and the cap layer 33 is formed so as to surround the hygroscopic layer 34. In other words, as to the organic EL display device 1 according to the first variation, the cap layer 33 has a hole over the bank 40, and the hygroscopic layer 34 is formed so as to fill the hole of the cap layer 33.

By forming the hygroscopic layer 34 with a hygroscopic agent, a hygroscopic agent can be arranged in high density over the bank 40, and the moisture absorption effect can be improved. Thus, the deterioration of the organic layer 31 due to moisture can be more powerfully prevented.

Figure 6:
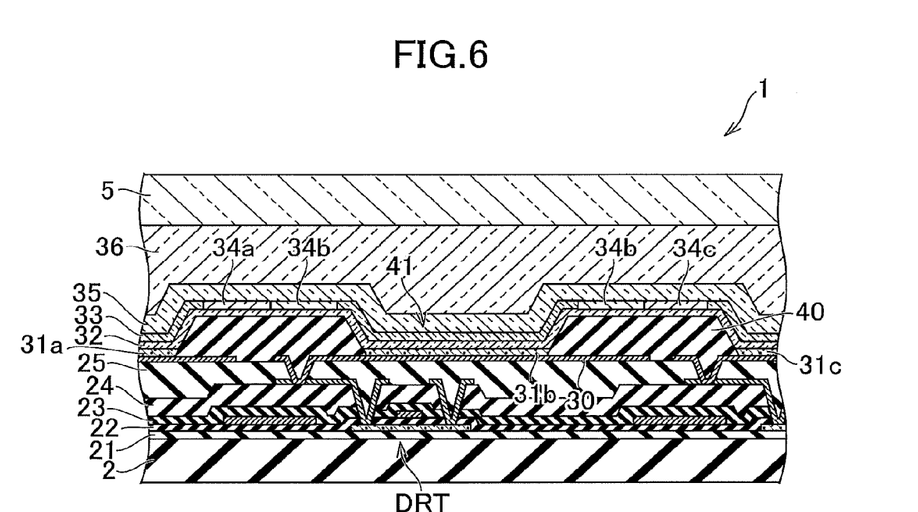
FIG. 6 is a cross sectional diagram of a pixel of an organic EL display device according to a second variation of the embodiment of the present invention.

FIG. 6 is a cross sectional diagram of a pixel of the organic EL display device 1 according to a second variation of the embodiment of the present invention. The organic EL display device 1 according to the second variation includes a first organic layer 31a including a light emitting layer that emits red light, a second organic layer 31b including a light emitting layer that emits green light, and a third organic layer 31c including a light emitting layer that emits blue light. Further, in the organic EL display device 1 according to the second variation, a density of a hygroscopic agent contained in the hygroscopic layer 34 changes in accordance with a color of light emitted from an adjacent light emitting layer. As to the other configuration, the organic EL display device 1 according to the second variation has a configuration similar to that of the organic EL display device 1 according to the embodiment of the present invention.

The organic EL display device 1 according to the second embodiment includes a first hygroscopic layer 34a, a second hygroscopic layer 34b, and a third hygroscopic layer 34c, densities of whose hygroscopic agents are different from one another. The first hygroscopic layer 34a is provided at a position adjacent to the first organic layer 31a, the second hygroscopic layer 34b is provided at a position adjacent to the second organic layer 31b, and the third hygroscopic layer 34c is provided at a position adjacent to the third organic layer 31c. The first hygroscopic layer 34a contains a hygroscopic agent at an optimized density regarding a material of the light emitting layer that emits red light, the second hygroscopic layer 34b contains a hygroscopic agent at an optimized density regarding a material of the light emitting layer that emits green light, and the third hygroscopic layer 34c contains a hygroscopic agent at an optimized density regarding a material of the light emitting layer that emits blue light. Note that the first hygroscopic layer 34a, the second hygroscopic layer 34b, and the third hygroscopic layer 34c might respectively contain a different hygroscopic agent, and a kind and a density of the hygroscopic agent might be selected so as to optimize the preventive effect against the deterioration due to moisture with respect to the adjacent organic layer 31.

According to the organic EL display device 1 according to the second variation, the configuration of the hygroscopic layer 34 is optimized with respect to the adjacent light emitting layer, and the deterioration of the organic layer 31 due to moisture can be prevented in accordance with a character of the light emitting layer.

Figure 7:
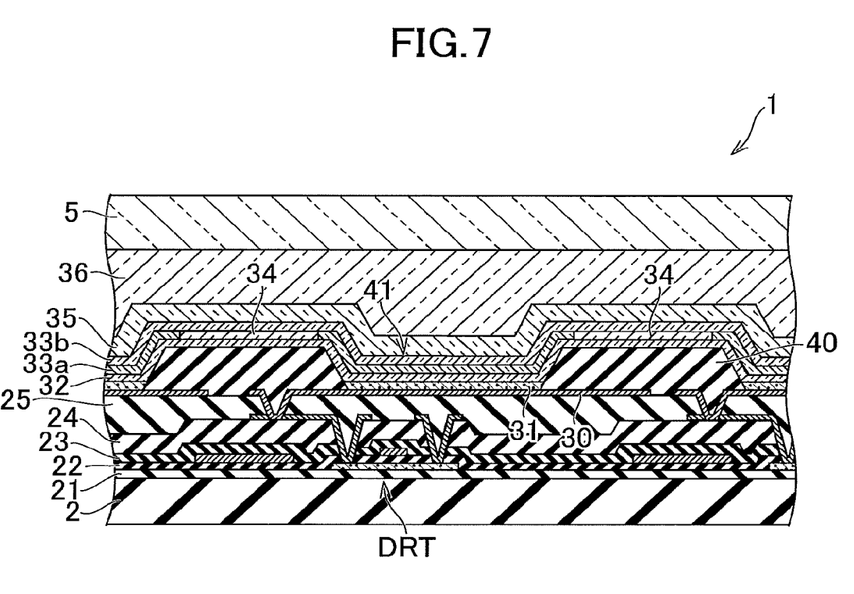
FIG. 7 is a cross sectional diagram of a pixel of an organic EL display device according to a third variation of the embodiment of the present invention.

FIG. 7 is a cross sectional diagram of a pixel of the organic EL display device 1 according to a third variation of the embodiment of the present invention. In the organic EL display device 1 according to the third variation, the cap layer 33 includes a plurality of layers. Specifically, the cap layer 33 includes a first cap layer 33a that is in contact with the opposing electrode 32, and a second cap layer 33b that is in contact with the sealing film 35. Further, the hygroscopic layer 34 is, over the bank 40, provided at least under the uppermost layer (the second cap layer 33b) of the cap layer 33. As to the other configuration, the organic EL display device 1 according to the third variation has a configuration similar to that of the organic EL display device 1 according to the embodiment of the present invention.

Since the cap layer 33 includes a plurality of layers, a thickness and a refractive index can be selected such that return light can be reduced with respect to light emitted to a display surface side from the light emitting layer. As to the organic EL display device 1 according to the present variation, the first cap layer 33a has a hole over the bank 40, and the hydroscopic layer 34 is formed so as to fill the hole of the first cap layer 33a. Further, the second cap layer 33b is formed so as to cover the first cap layer 33a and the hygroscopic layer 34.

Since the hygroscopic layer 34 is, over the bank 40, provided at least under the uppermost layer of the cap layer 33, the hygroscopic agent can be arranged closer to the organic layer 31, and moisture can be efficiently prevented from reaching the organic layer 31. Further, by forming the second cap layer 33b over the hygroscopic layer 34, the hygroscopic layer 34 does not contact the sealing film 35, and the deterioration of the hygroscopic agent can be prevented.

As to the organic EL display device 1 according to the third variation, the hygroscopic layer 34 may be a layer formed of a material that is a mixture of a material constituting the cap layer 33 and the hygroscopic agent, and may also be formed of the hygroscopic agent only. Further, as to the organic EL display device 1 according to the third variation, the density of the hygroscopic agent contained in the hygroscopic layer 34 may be changed in accordance with a color of light emitted from an adjacent light emitting layer.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a pixel electrode formed on an insulating surface;
   a bank that covers an edge of the pixel electrode and at the same time has an opening in which an upper surface of the pixel electrode is not covered by the bank;
   an organic layer that covers the opening and includes a light emitting layer;

an opposing electrode that is formed on the organic layer and the bank;

a cap layer that is formed on the opposing electrode; and a hygroscopic layer that contains a hygroscopic agent and that is formed on the opposing electrode in a region that overlaps with the bank but does not overlap with the opening in a planar view from a display surface side, wherein a density of the hygroscopic agent contained in the hygroscopic layer varies in accordance with a color of light emitted from the light emitting layer adjacent thereto.

2. The display device according to claim 1, wherein the hygroscopic layer is a layer formed of a material that is a mixture of a material that constitutes the cap layer and the hygroscopic agent.

3. The display device according to claim 1, wherein the hygroscopic layer does not contain a material that constitutes the cap layer but is a layer formed of a material that contains the hygroscopic agent.

4. The display device according to claim 1, wherein the cap layer includes a plurality of layers, and the hygroscopic layer is provided at least under an uppermost layer of the cap layer.

5. The display device according to claim 1, wherein the hygroscopic agent contains at least one of barium oxide, calcium oxide, calcium and zeolite.

\* \* \* \* \*